(12) United States Patent
Swart et al.

(10) Patent No.: US 8,907,694 B2
(45) Date of Patent: Dec. 9, 2014

(54) WIRING BOARD FOR TESTING LOADED PRINTED CIRCUIT BOARD

(75) Inventors: Mark A. Swart, Villa Park, CA (US); Kenneth R. Snyder, Pomona, CA (US)

(73) Assignee: Xcerra Corporation, Norwood, MA (US)

(*) Notice: Subject to any disclaimer, the term of this patent is extended or adjusted under 35 U.S.C. 154(b) by 368 days.

(21) Appl. No.: 12/959,765

(22) Filed: Dec. 3, 2010

(65) Prior Publication Data

US 2011/0148451 A1    Jun. 23, 2011

Related U.S. Application Data

(60) Provisional application No. 61/287,595, filed on Dec. 17, 2009.

(51) Int. Cl.
*G01R 31/00* (2006.01)
*G01R 31/28* (2006.01)
*G01R 31/319* (2006.01)

(52) U.S. Cl.
CPC ...... *G01R 31/2844* (2013.01); *G01R 31/31905* (2013.01)
USPC ........................................ 324/756.05; 29/830

(58) Field of Classification Search
CPC .................................................. H01L 25/0657
USPC .................. 324/756.05, 754, 755, 758, 761, 324/755.01; 29/830
See application file for complete search history.

(56) References Cited

U.S. PATENT DOCUMENTS

| | | | |
|---|---|---|---|
| 4,833,402 A | | 5/1989 | Boegh-Petersen |
| 4,977,370 A | * | 12/1990 | Andrews .................. 324/754.08 |
| 5,389,885 A | * | 2/1995 | Swart ....................... 324/754.14 |
| 5,498,964 A | * | 3/1996 | Kerschner et al. ............ 324/530 |
| 5,818,248 A | | 10/1998 | St. Onge |
| 5,945,836 A | | 8/1999 | Sayre et al. |
| 6,025,729 A | * | 2/2000 | Van Loan et al. ........ 324/750.25 |
| 6,047,469 A | | 4/2000 | Luna |
| 6,064,214 A | * | 5/2000 | Self .......................... 324/754.12 |
| 6,066,957 A | | 5/2000 | Van Loan et al. |
| 6,194,908 B1 | | 2/2001 | Wheel et al. |

(Continued)

FOREIGN PATENT DOCUMENTS

| | | |
|---|---|---|
| CN | 1766649 A | 5/2006 |
| JP | 2004-93468 A | 3/2004 |

(Continued)

OTHER PUBLICATIONS

International Search Report and Written Opinion for International Application No. PCT/US2010/060868, date of mailing Feb. 22, 2011; search completed Feb. 4, 2011, 7 pages.

(Continued)

*Primary Examiner* — Huy Q Phan
*Assistant Examiner* — Giovanni Astacio-Oquendo
(74) *Attorney, Agent, or Firm* — Christie, Parker & Hale, LLP

(57) ABSTRACT

A wiring board for transmission of test signals between test point locations on a circuit board under test and an external analyzer having compliant contacts making electrical contact with a pad positioned on a conductive surface circuit layer having a trace extending to a second pad having a hole for receipt of an interface pin electrically connected to the external analyzer.

12 Claims, 6 Drawing Sheets

(56) References Cited

U.S. PATENT DOCUMENTS

| | | | |
|---|---|---|---|
| 6,281,692 B1 * | 8/2001 | Bodenweber et al. | ... 324/754.18 |
| 6,384,341 B1 | 5/2002 | Rothermel et al. | |
| 6,414,504 B2 | 7/2002 | Johnston | |
| 6,489,791 B1 * | 12/2002 | Tsujii | ...... 324/756.02 |
| 6,784,675 B2 * | 8/2004 | Willard | ...... 324/754.11 |
| 6,963,209 B1 | 11/2005 | Gailus et al. | |
| 7,098,679 B2 | 8/2006 | Dick et al. | |
| 7,132,834 B2 * | 11/2006 | Tesdahl et al. | ...... 324/519 |
| 7,288,954 B2 | 10/2007 | Kirby et al. | |
| 7,616,019 B2 * | 11/2009 | Oshetski et al. | ...... 324/750.02 |
| 2008/0265933 A1 | 10/2008 | Tanioka et al. | |
| 2009/0200067 A1 | 8/2009 | Nozu | |
| 2011/0148448 A1 * | 6/2011 | St. Onge et al. | ...... 324/755.01 |

FOREIGN PATENT DOCUMENTS

| | | |
|---|---|---|
| JP | 2005-79144 A | 3/2005 |
| JP | 2009-76873 A | 4/2009 |
| WO | WO 2004/048981 A1 | 6/2004 |
| WO | WO 2006/012529 A1 | 2/2006 |
| WO | WO 2008/070673 A2 | 6/2008 |
| WO | WO 2008/095091 A2 | 8/2008 |

OTHER PUBLICATIONS

Official letter and Search Report issued for Taiwanese Patent Application No. 99143251 dated Apr. 22, 2013 with English Translation of Search Report, 12 pages.

Chinese Office action and Search Report for parallel Chinese Application No. 201080057353.5 issued Feb. 7, 2014, citing the above listed references (with English translation), 24 pages.

PCT Notification with International Preliminary Report on Patentability for International Application No. PCT/US2010/060868; date of issuance Jun. 19, 2012; date of mailing Jun. 28, 2012; 9 pages.

Communication from the European Patent Office forwarding the Supplementary European Search Report and Opinion for Application No. 10838264.9, dated Jul. 29, 2014, 9 pages.

* cited by examiner

WIRING BOARD FOR TESTING LOADED PRINTED CIRCUIT BOARD

CROSS-REFERENCE TO RELATED APPLICATION(S)

This application claims priority to U.S. Provisional Application No. 61/287,595 filed Dec. 17, 2009, the contents thereof are incorporated herein.

BACKGROUND OF THE INVENTION

This invention relates to test fixtures for the automatic testing of loaded printed circuit boards, and more particularly to a wiring board test fixture design having cingulated layers that electrically connect test probes to interface probes.

Automatic test equipment for checking printed circuit boards has long involved the use of a "bed-of-nails" test fixture to which the circuit board is mounted during testing. This test fixture includes a large number of nail-like, spring loaded test probes arranged to make electrical contact under spring pressure with designated test points on the circuit board under test (UUT). Any particular circuit laid out on a printed circuit board (PCB) is likely to be different from other circuits, and consequently, the bed-of-nails arrangement for contacting test points in a particular circuit board must be customized for that circuit board. When the circuit to be tested is designed, a pattern of test points to be used in testing, it is selected and a corresponding array of test probes is configured in the test fixture. This method typically involves drilling a pattern of holes in a probe plate to match the customized array of test probes and then mounting the test probes in the drilled holes in the probe plate. The circuit board is then mounted in the fixture, superimposed on the array of test probes. During testing, the spring loaded test probes are brought into spring pressure contact with the test points on the UUT. Electrical test signals are then transferred from the board to the test probes and then to the exterior of the fixture for communication with a high speed electronic test analyzer which detects continuity or lack of continuity between various test points and the circuits on the board.

Various approaches have been used in the past for bringing the test probes and the PCB under test into pressure contact for testing loaded printed circuit boards. One class of these fixtures is a wired test fixture in which the test probes are individually wired to separate interface contacts for use in transmitting test signals from the probes to the external electronically controlled test analyzer. These wired test fixtures were dedicated fixtures are often referred to as "vacuum test fixtures" since a vacuum may be applied to the interior of the test fixture housing during testing to compress the circuit board into contact with the test probes. Customized wired test fixtures of similar construction also can be made by using mechanical means, other than vacuum, to apply the spring force necessary for compressing the board into contact with the probes during testing.

Another class of test fixtures for testing bare printed circuit boards is the so-called grid type fixture in which the test points on the test side of a board are contacted by flexible pins or tilt pins which can move or otherwise be positioned to contact the random pattern of test points on the board and transfer test signals from the board to sets of interface pins arranged in a grid pattern on the receiver. In these grid type testers, fixturing is generally less complex and simpler than the customized wired test fixtures because there is no need to individually hard wire the test probes to separate interface contacts for each differently configured circuit to be tested; but with a grid system, the grid interfaces and test electronics are substantially more complex and costly.

In a grid type fixture for bare circuit board testing, the wiring for the grid array remains constant, independent of the configuration of the particular circuit board. What does change, however, is what is referred to as the translator fixture. The translator fixture includes a bottom plate having a hole pattern corresponding to the grid pattern of openings in a standard pin grid array, and a top plate having a hole pattern corresponding to the random off-grid pattern of contact points to be tested on a printed circuit board. A number of electrically conductive translator pins (these can be flexible pins or rigid tilt pins) are mounted in the holes of the top and bottom plates. As the translator pins travel through the translator fixture, they are redirected by the hole patterns of the plates to provide individual conductive paths between the standard grid pattern and the off-grid pattern corresponding to the test points on the circuit board under test. Extreme contact accuracy can be achieved between the translator pin and the test pad on the PCB because the translator pin does not extend beyond the upper surface of the top plate. The top plate in effect can accurately direct the translator pin precisely to the test pad through the holes in the top plate. The construction of the grid type translator fixture is typically less labor intensive than the rewiring of test probes in a wired type test fixture, making it simpler to customize the fixture to accommodate PCB's with different test point patterns. Therefore, it is often desirable to use a grid type test fixture when testing printed circuit boards having various different shapes and/or configurations.

Prior loaded printed circuit board test fixtures are expensive and time consuming to manufacture, hence a need exists for a low cost alternative for testing printed circuit boards, particularly for low volume applications.

SUMMARY OF THE INVENTION

One embodiment of the invention comprises a vacuum, pneumatic or mechanical loaded circuit board test fixture having a removable wiring board for transmitting test signals between a high force spring probe pattern and a test pattern on the unit under test (UUT). The high force spring probe pattern corresponds to a probe pattern in the base of the test fixture with sufficient spacing to accommodate up to 100 mil spring force probes capable of delivering high spring force to test high density test point arrangements for loaded circuit boards. The test pattern corresponds to a high density test point arrangement on the loaded PCB under test.

The wiring board comprises a plate and one or more transfer board layers positioned on the plate. The transfer board layer includes conductive pads, corresponding to test point locations on the unit under test, which are connected to a trace. The trace makes contact to a via positioned over holes in the transfer board and in the plate in which a SIP pin is positioned. A test probe, which makes contact with the test point location on the loaded circuit board, makes electrical contact to the pad on the transfer board and the test signal is transferred through the pad to the via by the trace and then to the SIP pin. The test signal is transmitted to the high force spring probes which makes electrical contact with the bottom of the SIP pin. The spring probes are electrically connected to an external electronic test analyzer to which the test signals are transmitted for analysis.

In an alternative embodiment, when a test probe is directly above a spring probe and they cannot be connected, there are two or more transfer boards and a spacer board positioned between the top transfer board and the bottom transfer board.

One test probe makes electrical contact to a pad connected to a trace on the transfer board above a spring probe position. The trace makes contact to a via with a SIP pin pressed into it making electrical contact. The SIP pin passes through the spacer board and the bottom transfer boards. The spring probe makes electrical contact to the bottom of the SIP pins. In yet another alternative embodiment the transfer board includes vias for both the test probe and the SIP pin. In this embodiment the test probe makes electrical contact to a via connected to a trace on the transfer board. The trace makes contact to another via with a SIP pin pressed into it making electrical contact. The spring probe makes electrical contact to the bottom of the SIP pin.

These and other features and advantages of the present invention will be better understood with reference to the following detailed description and the accompanying drawings.

DETAILED DESCRIPTION

Figure 1:
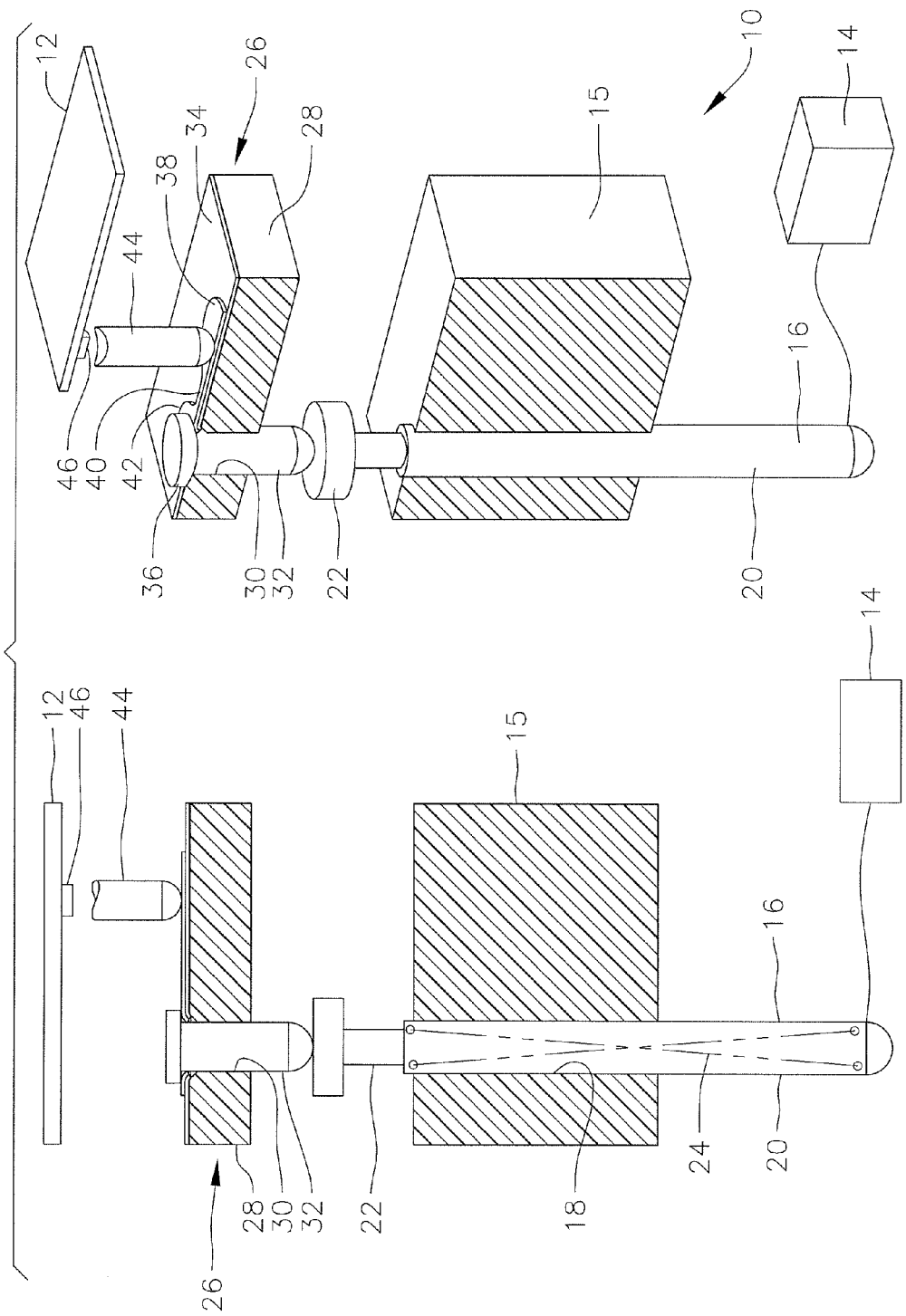
FIG. 1 is a fragmentary, schematic cross sectional view of a loaded board test fixture of the present invention.

FIG. 1 illustrates a loaded board test fixture 10 in accordance with the principals of the present invention. The test fixture is used to transmit test signals from a loaded printed circuit board 12 to an electronic test analyzer 14. The test fixture includes an interface probe plate 15 having a plurality of interface probes 16 positioned within holes 18 extending through the plate. For ease of illustration FIG. 1 depicts a single interface probe 16 positioned within a hole 18, however it is to be understood that plate 15 includes a plurality of interface probes 16 positioned within holes 18 in a uniform grid array across the plate 15. Interface probes 16 are electrically connected to external test analyzer 14. The interface probes are arranged in a hole pattern sufficiently far apart to accommodate spring probes, such as being spaced apart 100 mils on center.

The 100 mil spring probes should be able to deliver a sufficient spring force in a range from about 4 to about 16 ounces. Typical 100 mil spring probes are made of beryllium cooper alloy and include an outer receptacle or barrel 20, a plunger 22 extending from the barrel, and a compression spring 24 positioned inside the barrel for applying a biasing force to the plunger which reciprocates out of the barrel under spring pressure in a well known manner.

The test fixture of the present invention further includes a wiring board 26 which includes a plate 28 having a plurality of holes 30 for the positioning of interface pins 32. Interface pin 32 is preferably a SIP pin. Positioned on plate 28 is a transfer board 34 also having a hole 36 for SIP pin 32. Plate 28 and transfer board 34 are made of a non-conductive material. A conductive pad 38 is positioned on the top surface of transfer board 34 and has a conductive trace 40 extending to a via 42 positioned in hole 36. A test probe 44 is positioned above pad 38 which contacts the pad on one end, and the test point location 46 on the unit under test 12 on the opposite end. The test probe 44 is retained in the fixture by a plate, latex sheet or other method known in the industry.

In the test fixture embodiment illustrated in FIG. 1 there is one transfer board 34. The test probe 44 makes electrical contact to pad 38 which is connected to trace 40 on the transfer board. The trace makes contact to via 42 with a SIP pin 32 pressed into it making electrical contact. The test signal goes from the test point location 46 on the printed circuit board 12 through test probe 38, to pad 34 and then to trace 40 and via 42 where it is transmitted to pin 32 and ultimately to interface probe 22 which makes contact with the end of SIP pin 32 before being transmitted to test analyzer 14. Again it is to be understood for ease of illustration FIG. 1 illustrates a single test point location and a single pad on transfer board 34, however transfer board 34 includes as many pads, traces connected to vias and SIP pins, and test probes as are required by the number of test point locations on the printed circuit board under test 12. Wiring board 26 permits the off grid transfer of test signals from the printed circuit board to an on-grid pattern of interface probes 16.

Figure 2:
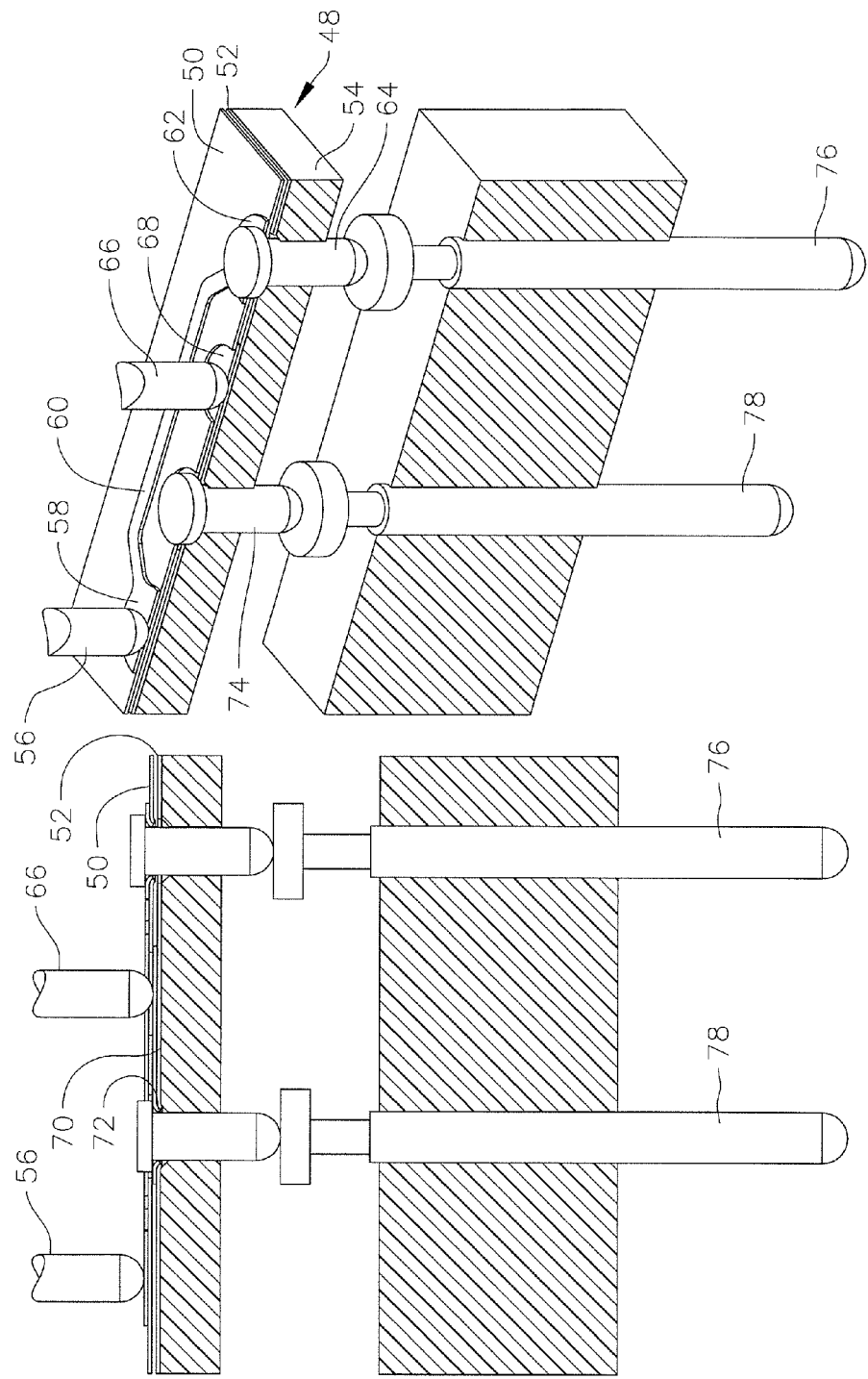
FIG. 2 is a fragmentary, schematic cross-sectional view of an alternative loaded board test fixture of the present invention.

FIG. 2 illustrates an alternative wiring board 48 having two transfer boards 50,52 positioned on plate 54. On transfer board 50 a test probe 56 makes electrical contact to a pad 58 connected to trace 60 which extends to via 62. A SIP pin 64 is pressed into via 62 making electrical contact. Test probe 66 makes electrical contact to pad 68 connected to trace 70 on transfer board 52. Trace 70 makes contact to via 72 having SIP pin 74 pressed into it making electrical contact. Interface probes 76 and 78 are in electrical contact with SIP pins 64 and 74 respectively. Transfer board 52 has holes for every SIP pin extending through the transfer board and transfer board 50 has holes for every SIP pin extending there through as well as holes for every test probe required to extend to pads located on transfer board 52. The wiring board 48 includes multiple transfer boards to accommodate test pad and trace locations for multiple test point locations on the unit under test without interfering with one another.

Figure 3:
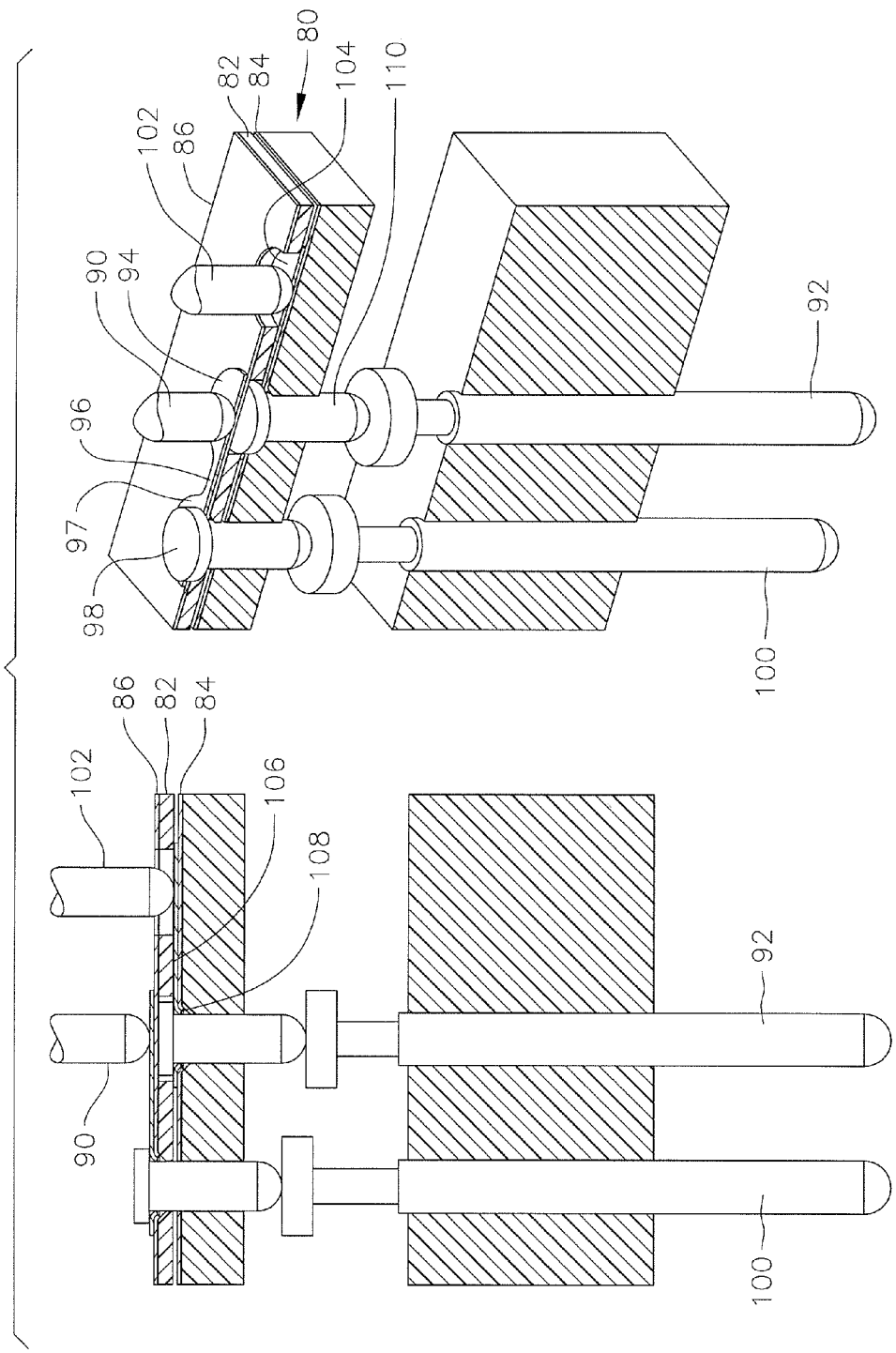
FIG. 3 is a fragmentary, schematic cross-sectional view of another alternative embodiment loaded board test fixture of the present invention.

FIG. 3 illustrates another alternative embodiment wiring board 80 which includes a spacer board 82 positioned in between transfer boards 84 and 86. The use of a spacer board between transfer boards 84 and 86 is necessary when a test probe 90, because of a test point location on the unit under test, is directly above an interface probe 92 and they cannot be electrically connected. Test probe 90 makes electrical contact to pad 94 connected to trace 96 which contacts via 97 and SIP pin 98. Pad 94 is positioned above interface probe 92. SEP pin 98 is pressed into via 97 which electrically communicates with interface probe 100. Test probe 102 makes electrical contact to pad 104 connected to trace 106 and via 108 having SIP pin 110 pressed into it. Interface probe 92 contacts SIP pin 110.

Figure 4:
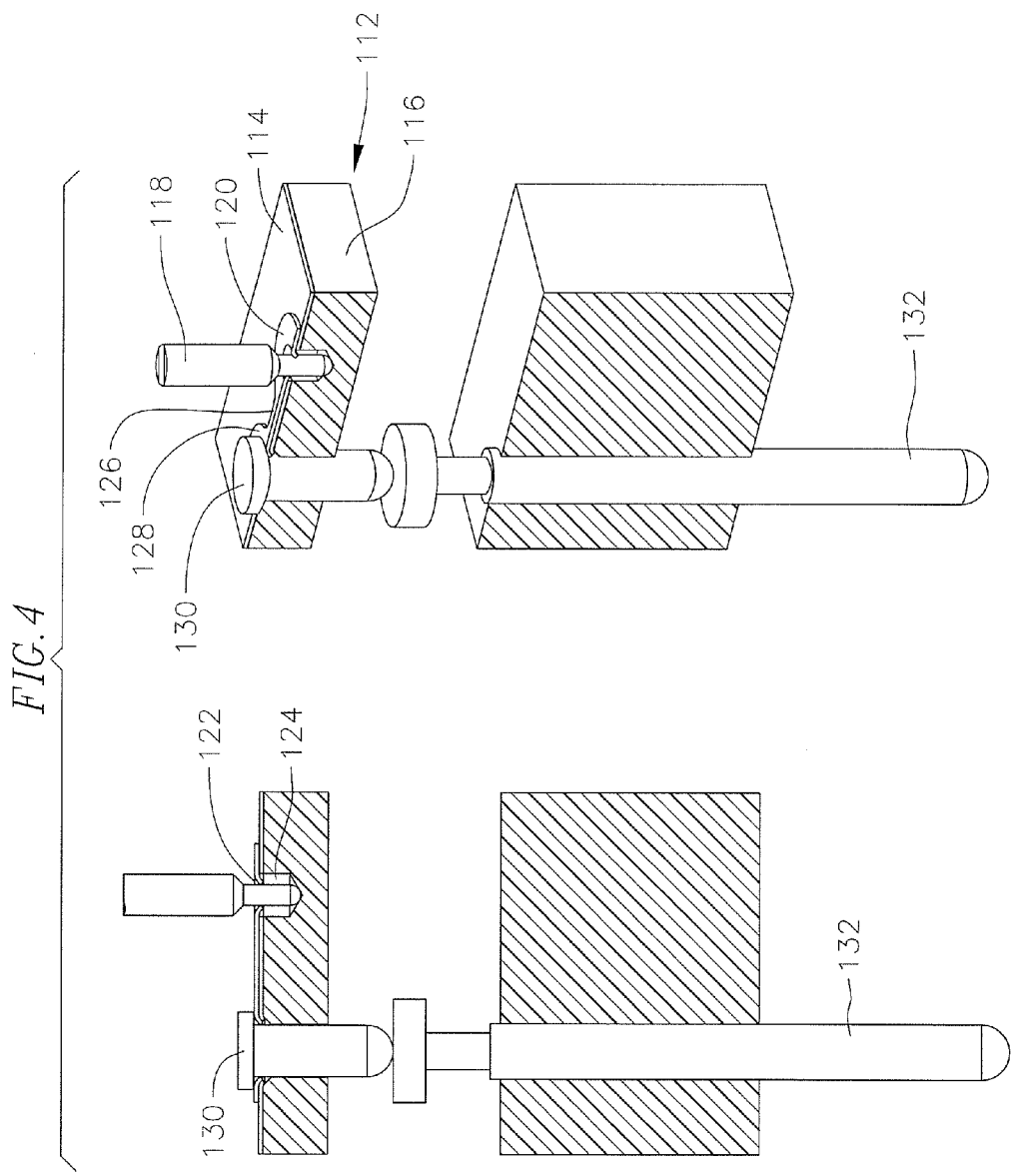
FIG. 4 is a fragmentary, schematic cross-sectional view of another alternative embodiment loaded board test fixture of the present invention.

FIG. 4 illustrates another alternative transfer board 112. In this embodiment there is one transfer board 114 positioned on plate 116. A test probe 118 makes electrical contact to a via positioned through a hole 122 in transfer board 114 which also extends into a cavity 124 in plate 116. Via 120 is connected to a trace 126 which makes contact with a second via 128 having a SIP pin 130 pressed into it. SIP pin 130 extends through holes in the transfer board and plate 116 to make contact with interface probe 132.

Figure 5:
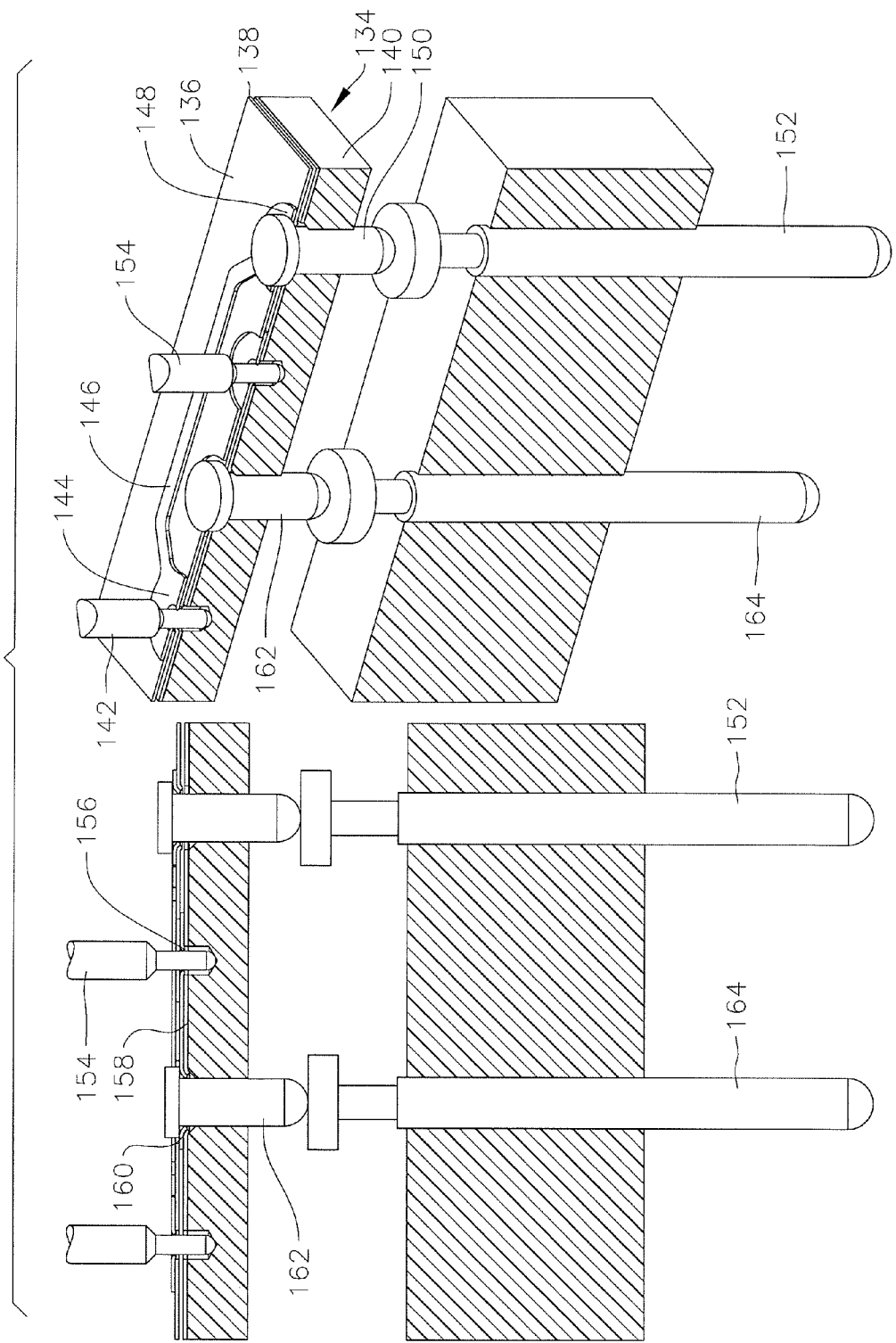
FIG. 5 is a fragmentary, schematic cross-sectional view of another alternative embodiment loaded board test fixture of the present invention.

FIG. 5 illustrates yet another alternative embodiment wiring board 134. In this embodiment there are multiple transfer boards 136 and 138 positioned on plate 140. On transfer board 136 test probe 142 makes electrical contact to via 144 connected to trace 146 which in turn makes contact to a second via 148 having a SIP pin 150 pressed into it. Interface probe 152 makes electrical contact to the bottom of SIP pin 150. Test probe 154 makes electrical contact to via 156 which is connected to trace 158 which extends to second via 160 having SIP pin 162 pressed into it. Interface probe 164 makes electrical contact to the bottom of SIP pin 162. Transfer board 136 has holes for each SIP pin extending therethrough as well as holes for each test probe making contact with a via on transfer board 138.

Figure 6:
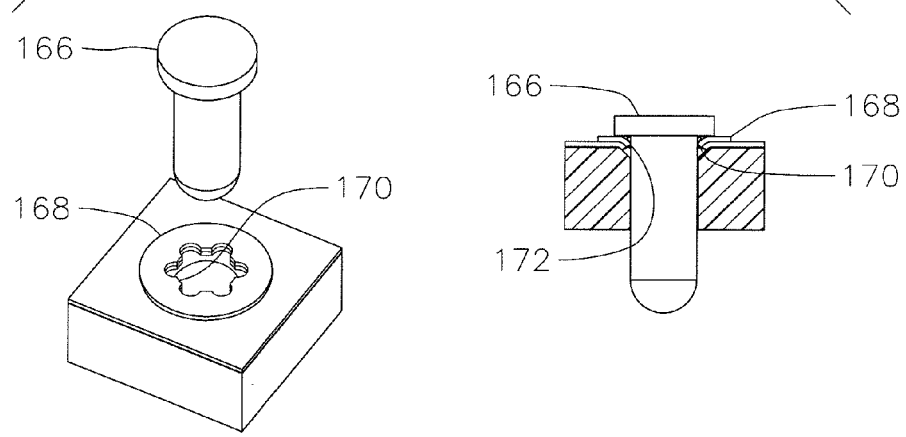
FIG. 6 is a detailed view of a SIP pin and trace connection of the test fixture of the present invention.
Figure 7:
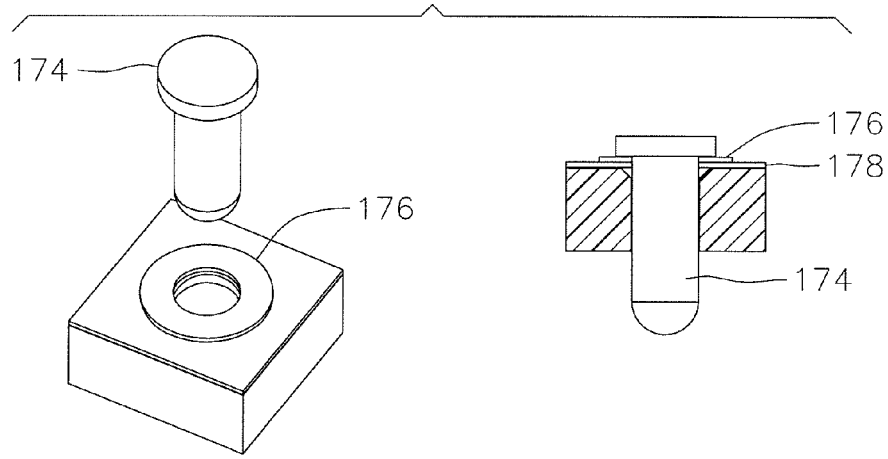
FIG. 7 is detailed view of an alternative SIP pin and trace connection of the present invention.
Figure 8:
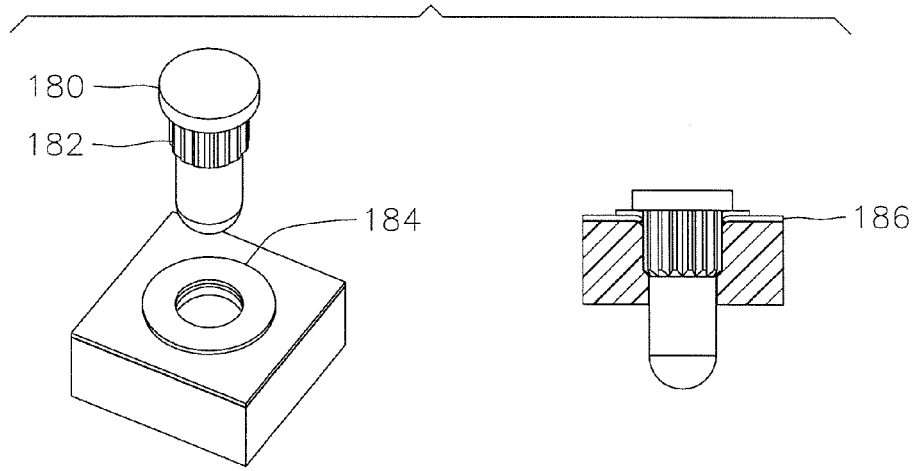
FIG. 8 is a detailed view of another alternative embodiment SIP pin and trace connection of the present invention.

FIGS. 6-8 illustrate the electrical connection between SIP pins and vias. FIG. 6 illustrates SIP pin 166 which is pressed into via 168 having a plurality of flaps 170 that make contact to the side 172 of SIP pin 166. In FIG. 7 SIP pin 174 is pressed through via 176 and makes contact with trace 178. In FIG. 8, SIP pin 180 includes a knurled edge 182 which when pressed through via 184, the knurled edge makes electrical contact with trace 186.

Although the present invention has been illustrated with respect to several embodiments thereof, it is to be understood that the invention is not to be so limited since changes and modifications can be made therein which are within the full intended scope of the invention as hereinafter claimed.

What is claimed is:

1. A loaded printed circuit board test fixture comprising:
   an array of spaced interface probes extending through a probe plate and adapted for electrical connection to an external electronic test analyzer;
   a plurality of test probes for contacting test point locations on a loaded printed circuit board under test;
   a wiring board positioned between the probe plate and the loaded printed circuit board under test for routing test signals from the test probes to the interface probes;
   the wiring board having at least one circuit layer positioned on top surface communicating with a plurality of interface pins extending through the wiring board at a first location on the wiring board and communicating with the test probes at a second location on the wiring board spaced from the first location.

2. The fixture of claim 1, wherein the wiring board further includes a transfer board and the circuit layer is positioned on the transfer board.

3. The fixture of claim 2, wherein there are a plurality of transfer boards each having at least one circuit layer.

4. The fixture of claim 3, further comprising a spacer board positioned between adjacent transfer boards.

5. The fixture of claim 2, wherein the circuit layer includes a via and a trace.

6. The wiring board of claim 2, wherein there are a plurality of transfer boards each having at least one circuit layer.

7. The wiring board of claim 6, further comprising a spacer board positioned between adjacent transfer boards.

8. The fixture of claim 1, wherein the circuit layer includes a pad and a trace.

9. The fixture of claim 8, wherein the trace contacts a via positioned in a hole in the transfer board.

10. The fixture of claim 9, wherein each interface pin extends through a via.

11. The fixture of claim 10, wherein the interface pin has knurled surfaces for contacting the trace.

12. The fixture of claim 9, wherein the via has a plurality of flaps around an opening.

* * * * *